United States Patent
Yim

(10) Patent No.: US 7,688,101 B2
(45) Date of Patent: Mar. 30, 2010

(54) SEMICONDUCTOR CHIP TEST APPARATUS AND TESTING METHOD

(75) Inventor: Sang Yoon Yim, Seoul (KR)

(73) Assignee: Dongbu Hitek Co., Ltd., Seoul (KR)

(*) Notice: Subject to any disclaimer, the term of this patent is extended or adjusted under 35 U.S.C. 154(b) by 0 days.

(21) Appl. No.: 12/326,836

(22) Filed: Dec. 2, 2008

(65) Prior Publication Data
US 2009/0167340 A1    Jul. 2, 2009

(30) Foreign Application Priority Data
Dec. 27, 2007    (KR)    .................. 10-2007-0138899

(51) Int. Cl.
*G01R 31/26*    (2006.01)
(52) U.S. Cl. ...................... 324/765; 324/73.1
(58) Field of Classification Search .................. None
See application file for complete search history.

(56) References Cited

U.S. PATENT DOCUMENTS 6,545,497 B2 * 4/2003 Hebert et al. ............... 324/765
7,227,351 B2 * 6/2007 Kim et al. ................ 324/158.1

FOREIGN PATENT DOCUMENTS

KR    10-2006-0072184    6/2006

* cited by examiner

*Primary Examiner*—Minh N Tang
(74) *Attorney, Agent, or Firm*—Workman Nydegger

(57) ABSTRACT

A semiconductor chip test apparatus includes a plurality of power supply units, each supplying power to a semiconductor chip having a power input terminal, and a tester configured to measure an output current of at least one of the plurality of power supply units, and to generate a switching control signal when the measured output current is greater than a predetermined current. The semiconductor chip test apparatus also includes a plurality of relays each arranged between a common ground of the tester and a different ground of the semiconductor chip. Further, the semiconductor chip test apparatus includes a relay controller, such as a control bit generator, configured to selectively close one or more of the plurality of relays in response to the switching control signal from the tester.

6 Claims, 2 Drawing Sheets

SEMICONDUCTOR CHIP TEST APPARATUS AND TESTING METHOD

CROSS-REFERENCE TO RELATED APPLICATION

This application claims priority to Korean Application No. 10-2007-0138899, filed on Dec. 27, 2007, which is incorporated herein by reference in its entirety.

BACKGROUND

1. Field of the Invention

Embodiments of the present invention relate in general to a semiconductor chip test apparatus for measuring a standby current being applied to a semiconductor chip from a power supply unit and a testing method for measuring the standby current.

2. Description of Related Art

Generally, a semiconductor integrated circuit undergoes an electrical characteristic test during fabrication to check whether it is normal or defective. For such an electrical characteristic test, a tester for generating an electrical signal and applying it to a semiconductor chip to be tested, and its peripheral auxiliary devices are used.

FIG. 1 illustrates an apparatus which enables a typical semiconductor chip tester to measure current by utilizing a common ground of the tester.

As shown in FIG. 1, the typical semiconductor chip test apparatus tests a semiconductor chip 10. The typical semiconductor chip test apparatus includes first and second power supply units 20 and 22, and a tester 30.

The semiconductor chip 10, which is a package to be tested, has a power input terminal VDD. It is also connected to a common ground VSS.

Each of the first and the second power supply units 20 and 22 serves to supply power to the power input terminal VDD of the semiconductor chip 10.

The tester 30 measures an output current (e.g., a standby current IDDS) of each of the first and the second power supply units 20 and 22.

In general, a semiconductor chip does not commonly use a ground, but each power supply unit has a separate ground. However, since most of semiconductor chip testers make use of a common ground as in FIG. 1, it is impossible to measure current flowing through different current paths, such as current paths flowing to an input/output (I/O) ground and to a core ground.

Therefore, a hot spot may not be detected upon analyzing defects, making a defect analysis on a current path difficult. During actual analysis of defects, current can frequently flow from the core side's power supply unit to the I/O ground or to the core ground.

In addition, many recently developed semiconductor chips are mobile product family chips, and thus a supply current or a standby current IDDS is a very critical parameter in testing such semiconductor devices. In system-on-chip (SOC) semiconductor chips there are several power supply units within the chip, each of which has a different ground, e.g., a PLL (Phase Locked Loop) ground, two core grounds, an I/O ground, etc.

SUMMARY OF SOME EXAMPLE EMBODIMENTS

In general, example embodiments of the invention relate to detecting a current path by separating grounds in power supply units upon testing semiconductor chips and considering a case where an excessive current flows.

In accordance with a first embodiment of the present invention, a semiconductor chip test apparatus includes a plurality of power supply units, each supplying power to a semiconductor chip having a power input terminal, and a tester configured to measure an output current of at least one of the plurality of power supply units, and to generate a switching control signal when the measured output current is greater than a predetermined current. The semiconductor chip test apparatus also includes a plurality of relays each arranged between a common ground of the tester and a different ground of the semiconductor chip. Further, the semiconductor chip test apparatus includes a relay controller, such as a control bit generator, configured to selectively close one or more of the plurality of relays in response to the switching control signal from the tester.

In accordance with a second embodiment, a method of testing a semiconductor chip includes supplying power with a plurality of power supply units to a semiconductor chip. Then, with a tester, an output current of at least one of the plurality of power supply units may be measured and, if the measured output current is greater than a predetermined current, current paths between a common ground of the tester and different grounding points of the semiconductor chip may be selectively activated to measure current flowing through each of the current paths.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

Aspects of example embodiments of the invention will become apparent from the following description of example embodiments, given in conjunction with the accompanying drawings, in which.

DETAILED DESCRIPTION OF SOME EXAMPLE EMBODIMENTS

Figure 1:
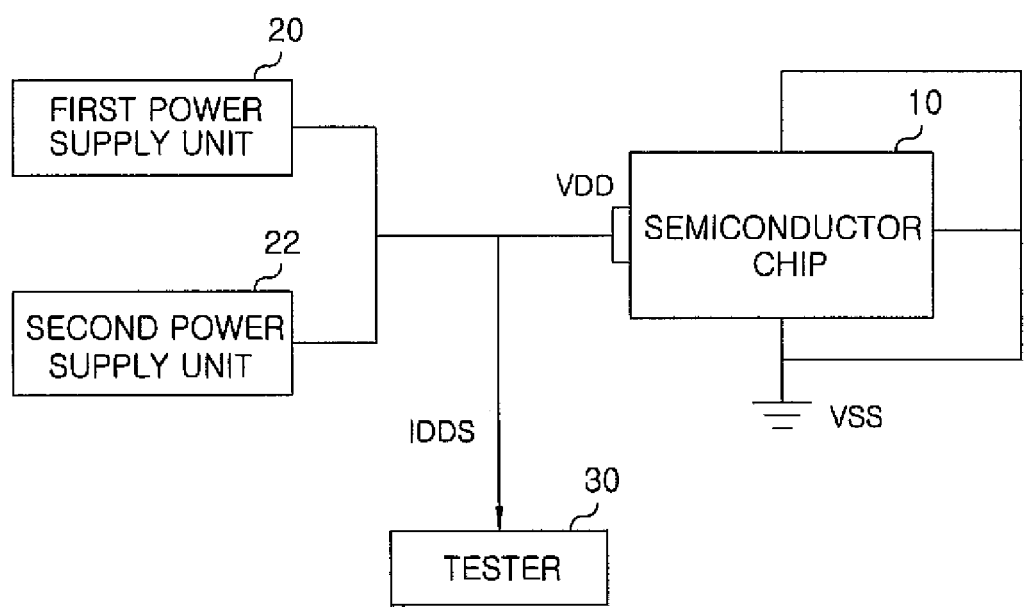
FIG. 1 shows a block diagram of a typical semiconductor chip test apparatus.

In the following detailed description of the embodiments, reference is made to the accompanying drawings that show, by way of illustration, specific embodiments of the invention. In the drawings, like numerals describe substantially similar components throughout the several views. These embodiments are described in sufficient detail to enable those skilled in the art to practice the invention. Other embodiments may be utilized and structural, logical and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

Figure 2:
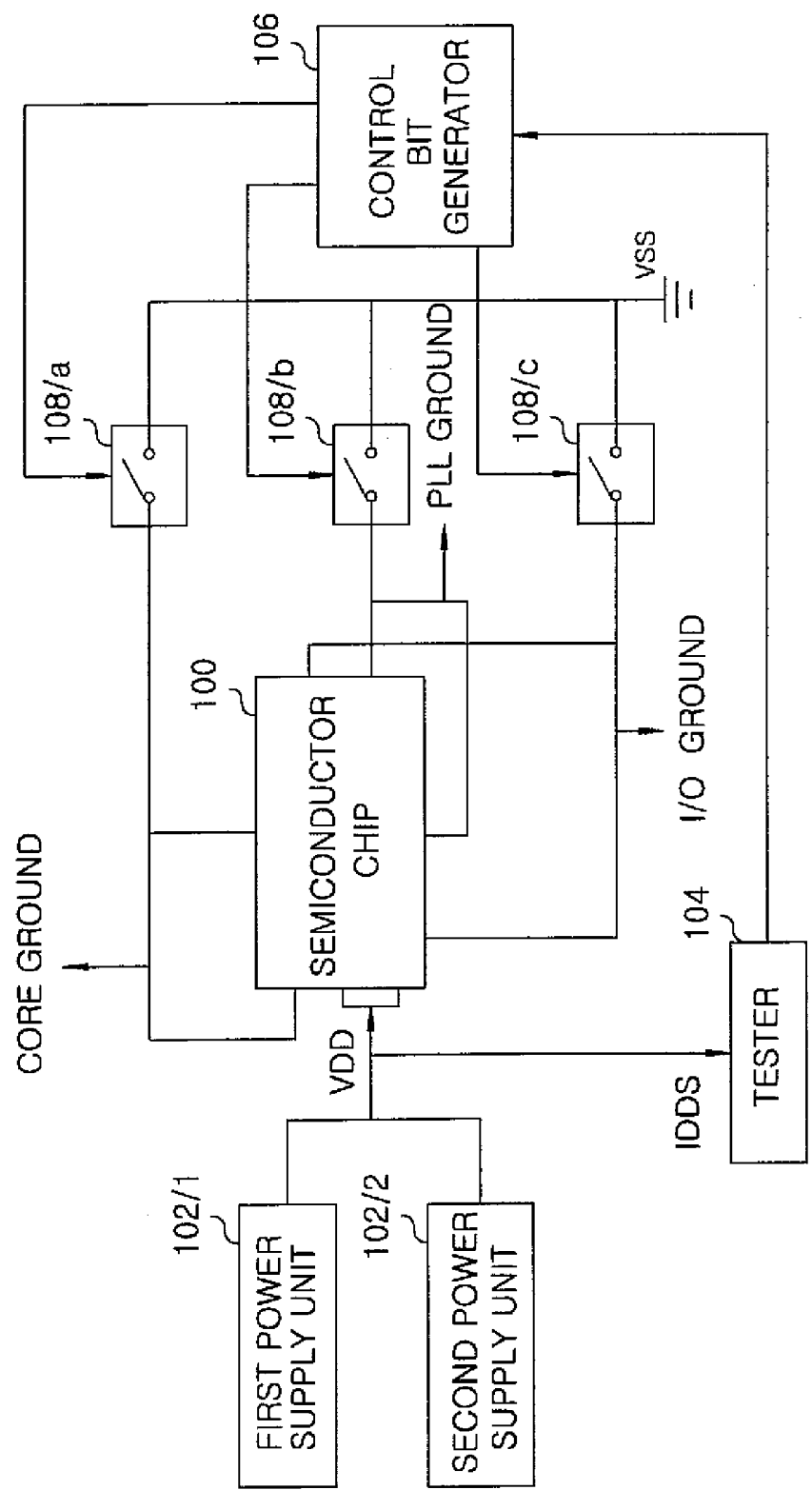
FIG. 2 illustrates a block diagram of a semiconductor chip test apparatus in accordance with an embodiment of the present invention.

FIG. 2 illustrates a block diagram of a semiconductor chip test apparatus in accordance with an embodiment of the present invention. The semiconductor chip test apparatus shown in FIG. 2 includes a semiconductor chip 100, first and second power supply units 102/1 and 102/2, a tester 104, a control bit generator 106, and plural relays 108/a, 108/b and 108/c.

The semiconductor chip 100, which is a package to be tested, may have a power input terminal VDD. The semiconductor chip 100 may also be selectively connected to a common ground VSS by way of one or more of each of the relays 108/a, 108/b and 108/c.

Each of the first and the second power supply units 102/1 and 102/2 serves to supply power to the power input terminal VDD of the semiconductor chip 100. Although only two power supply units 102/1 and 102/2 are illustrated in FIG. 2 for convenience of explanation, it will easily be appreciated to those skilled in the art that additional power supply units may be further provided.

The tester 104 may measure an output current (e.g., a standby current IDDS) of each of the first and the second power supply units 102/1 and 102/2. In addition, the tester 104 may provide a relay switching signal to a relay controller, such as the control bit generator 106, when the measured standby current of each of the first and the second power supply units 102/1 and 102/2 exceeds a predetermined current, e.g., 10 mA.

The control bit generator 106 may selectively control the switching operation of each of the relays 108/a, 108/b and 108/c depending upon the relay switching signal provided from the tester 104. The control bit generator 106 may selectively control the relays' switching operations with control bits, for example, as further explained below.

The control bit generator 106 may selectively apply a control bit to each of the relays 108/a, 108/b and 108/c to perform switching control such that only one of the relays, e.g., only the first relay 108/a, is in a closed state. A predetermined period of time after the first relay 108/a is in a closed state, a sequential switching control operation may be performed such that only the second relay 108/b is in a closed state and then only the third relay 108/c is in a closed state.

Among the relays 108/a, 108/b and 108/c, the first relay 108/a may be arranged between a core ground of the semiconductor chip 100 and a common ground VSS and may be closed or open in response to a control bit from the control bit generator 106. When the first relay 108/a is closed, the core ground and the common ground VSS are connected to each other, and thus, current flowing toward the core ground can be measured by the tester 104.

The second relay 108/b may be arranged between a PLL ground of the semiconductor chip 100 and the common ground VSS and may be closed or open in response to a control bit from the control bit generator 106. When the second relay 108/b is closed, the PLL ground and the common ground VSS are connected to each other, and thus, current flowing toward the PLL ground can be measured by the tester 104.

The third relay 108/c may be arranged between an I/O ground of the semiconductor chip 100 and the common ground VSS and may be closed or open in response to a control bit from the control bit generator 106. When the third relay 108/c is closed, the I/O ground and the common ground VSS are connected to each other, so that current flowing toward the I/O ground can be measured by the tester 104.

In testing the semiconductor chip 100, when an excessive standby current IDDS or supply current is measured, the core ground, the I/O ground, and the PLL ground of the semiconductor chip 100 may be sequentially closed and connected to the common ground VSS of the tester 104 by each of the relays 108/a, 108/b, and 108/c. During an initial measurement, however, the relays 108/a, 108/b, and 108/c may each be in a default state of closed (i.e., connected to the common ground VSS).

When an excessive standby current IDDS is detected during an initial measurement, first, the relay 108/a may be switched to a closed state while the relays 108/b and 108/c are each in an open state. Then a current flowing toward the core ground through the relay 108/a may be measured.

Next, by sequentially closing the relays 108/b and 108/c, current flowing to each of the I/O ground and the PLL ground can be measured. This can be done by using the same method as applied to the core ground.

Now, the operation of each of the relays 108/a, 108/b, and 108/c by the control bit generator 106 will be described in more detail.

The control of each of the relays 108/a, 108/b, and 108/c is done by a corresponding control bit from the control bit generator 106. In an initial state, each of the control bits may be set to "on". When an excessive current is measured, each of the relays may be set to "on" one by one while the other relays are set to "off".

For example, in the initial state, the control bit generator 106 may set all of the control bits to "on" such that all of the relays 108/a, 108/b, and 108/c are in a closed state.

When an excessive current is measured, only the control bit to, e.g., the first relay 108/a may be set to "on", while the control bits to the second and the third relays 108/b and 108/c are set to "off". Therefore, only the first relay 108/a is set to be in a closed state, while the second and the third relays 108/b and 108/c are set to be in an open state. Thus, current flowing toward the core ground through the first relay 108/a can be measured by the tester 104.

Then, the control bit generator 106 may set only the control bit to the second relay 108/b to "on", while setting the control bits to the first and the third relays 108/a and 108/c to "off". Therefore, only the second relay 108/b is set to be in a closed state, while the first and the third relays 108/a and 108/c are set to be in an open state. Thus, current flowing toward the PLL ground through the second relay 108/b can be measured by the tester 104.

Similarly, the control bit generator 106 may set only the control bit to the third relay 108/c to "on", while setting the control bits to the first and the second relays 108/a and 108/b to "off". Therefore, only the third relay 108/c is set to be in a closed state, while the first and the second relays 108/a and 108/b are set to be in an open state. Thus, current flowing toward the I/O ground through the third relay 108/c can be measured by the tester 104.

As can be seen from FIG. 2, when a short occurs between, for example, a core power VDD and an I/O ground, current does not flow in a significant amount to other grounds. Thus, by sequentially switching each of the relays 108/a, 108/b, and 108/c, the current flowing to the I/O ground as a result of the short can be pinpointed and, therefore, defect analysis can be done more easily.

In accordance with the example embodiments described above, current flowing to individual grounding points can be detected by separating grounds individually upon a power short of a semiconductor chip and at the time of measuring an IDDS current.

In addition, since the conventional chip test method couples all grounds to a common ground of a tester, it is impossible to identify the path of a detected current at all. However, methods of the present invention enable the identification of a current path, thus making defect analysis easier and achieving an improved yield.

By coupling each ground pad to a common ground VSS of the tester individually, e.g., by controlling relays with control bits, it is possible to easily identify quantities of current that flow through each of several current paths in an actual layout.

While the invention has been shown and described with respect to the preferred embodiments, it will be understood by those skilled in the art that various changes and modification may be made without departing from the spirit and scope of the invention as defined in the following claims.

What is claimed is:

1. A semiconductor chip test apparatus, comprising:
   a plurality of power supply units, each supplying power to a semiconductor chip having a power input terminal;
   a tester configured to measure an output current of at least one of the plurality of power supply units and to generate a switching control signal when the measured output current is greater than a predetermined current;
   a plurality of relays each arranged between a common ground of the tester and a different ground of the semiconductor chip; and
   a relay controller configured to selectively close one or more of the plurality of relays in response to the switching control signal from the tester.

2. The semiconductor chip test apparatus of claim 1, wherein the relay controller is configured to close each of the plurality of relays during an initial measurement.

3. The semiconductor chip test apparatus of claim 1, wherein the relay controller is a control bit generator configured to selectively close one or more of the plurality of relays with control bits.

4. The semiconductor chip test apparatus of claim 1, wherein the tester is configured to control the relay controller to close the plurality of relays in a sequence.

5. The semiconductor chip test apparatus of claim 1, wherein the output current is a standby current.

6. A method of testing a semiconductor chip comprising:
   supplying power with a plurality of power supply units to a semiconductor chip;
   with a tester, measuring an output current of at least one of the plurality of power supply units and determining whether the measured output current is greater than a predetermined current;
   when the measured output current is determined to be greater than the predetermined current, selectively activating current paths between a common ground of the tester and different grounding points of the semiconductor chip to measure current flowing through each of the current paths.

* * * * *